United States Patent
Yan et al.

(10) Patent No.: US 7,629,861 B2
(45) Date of Patent: Dec. 8, 2009

(54) TEMPERATURE COMPENSATION ATTENUATOR

(75) Inventors: Yuejun Yan, Shenzhen (CN); Yuepeng Yan, Shenzhen (CN)

(73) Assignee: Yantel Corporation, Shenzhen (CN)

( * ) Notice: Subject to any disclaimer, the term of this patent is extended or adjusted under 35 U.S.C. 154(b) by 0 days.

(21) Appl. No.: 12/394,267

(22) Filed: Feb. 27, 2009

(65) Prior Publication Data

US 2009/0160601 A1    Jun. 25, 2009

Related U.S. Application Data

(63) Continuation-in-part of application No. 12/106,408, filed on Apr. 21, 2008, now Pat. No. 7,528,677, which is a continuation-in-part of application No. 10/597,985, filed as application No. PCT/CN2005/000586 on Apr. 28, 2005, now Pat. No. 7,362,196.

(30) Foreign Application Priority Data

May 28, 2004   (CN)   ............ 2004 1 0027307
Dec. 7, 2008   (CN)   ............ 2008 1 0190568

(51) Int. Cl.
    *H01P 1/22* (2006.01)
(52) U.S. Cl. ...................... 333/81 A; 338/216
(58) Field of Classification Search ............ 333/81 A, 333/81 R; 338/216
    See application file for complete search history.

*Primary Examiner*—Stephen E Jones
(74) *Attorney, Agent, or Firm*—Matthias Scholl P.C.; Matthias Scholl

(57) ABSTRACT

A temperature compensation attenuator comprising: a base; a first film thermistor having two edges, a second film thermistor having a first edge, a second edge; and a third edge; an input terminal; an output terminal and a ground terminal; wherein the first film thermistor and the second film thermistor are disposed on the base; one edge of the first film thermistor is contacted to the input terminal; the other edge of the first film thermistor is contacted to the output terminal; the first edge of the second film thermistor is contacted to the input terminal; the second edge of the second film thermistor is contacted to the output terminal, the third edge of the second film thermistor is contacted to the ground terminal; and the first film thermistor has a temperature characteristic opposite to that of the second film thermistor.

20 Claims, 3 Drawing Sheets

TEMPERATURE COMPENSATION ATTENUATOR

CROSS-REFERENCE TO RELATED APPLICATIONS

This application is a continuation in part of U.S. Ser. No. 12/106,408 filed on Apr. 21, 2008, now pending, which is a continuation in part of U.S. Ser. No. 10/597,985 filed on Apr. 28, 2005, now U.S. Pat. No. 7,362,196, granted Apr. 22, 2008, which is a National Stage Application of International Patent Application No. PCT/CN2005/000586, which is based on Chinese Patent Application No. 200410027307.7, filed May 18, 2004. This application further claims priority pursuant to 35 U.S.C. § 119 and the Paris Convention Treaty to Chinese Patent Application No. 200810190568.9 filed Dec. 7, 2008. The contents of all of these specifications are incorporated herein by reference.

BACKGROUND OF THE INVENTION

1. Field of the Invention

The invention relates to temperature compensation attenuators for compensating temperature characteristics of high frequency or microwave devices and systems used in electronics and communication. The attenuators can be applied in various circuits and systems utilizing high frequency waves or microwaves, and more particularly, are suitable for use in mobile communication systems, satellite communication systems, satellite navigational systems, and radar systems which require strict temperature characteristics.

2. Description of the Related Art

Current techniques for reducing the temperature drift of high frequency or microwave active devices are quite complex, utilize many applied components, and exhibit lengthy R&D periods, high cost, and high rate of failure. For example, the gain of high frequency or microwave power amplifiers, and thus their power output, varies with external temperature, seriously deteriorating the characteristics and stability of the amplifiers and even of the entire systems.

To reduce the variance in the gain and the power of high frequency or microwave power amplifiers resulting from the variance in environmental temperature, many active devices, such as temperature detectors, power couplers, wave detectors, programmable signal processors, storage, and preamplifiers with automatic gain control (AGC) and automatic power control (APC) capabilities are included in the amplifiers themselves, their power sources and their control systems. Moreover, it is a prominent problem to increase rated power of the attenuator while maintaining the same size of substrates and materials.

While resolving the temperature drift characteristics, several features of the devices must be satisfied:

(1) Wide band characteristic and high rated power;
(2) Minimal refection coefficient for both the input and the output terminals;
(3) High isolation for both the input and the output terminals; and
(4) The characteristic impedance of both the input and the output terminals complying with the requirement of the access system (e.g., 50 Ohm or 75 Ohm).

SUMMARY OF THE INVENTION

One objective of the invention is to provide a temperature compensation attenuator to realize the compensation of the temperature characteristic of high frequency or microwave active devices and systems in electronics and communications.

In one embodiment of the invention described herein, provided is a temperature compensation attenuator comprising: a base; a film thermistor having two edges; a film resistor having a first edge, a second edge; and a third edge; an input terminal; an output terminal and a ground terminal; wherein the film thermistor and the film resistor are disposed on the base; one edge of the film thermistor is contacted to the input terminal; the other edge of the film thermistor is contacted to the output terminal; the first edge of the film resistor is contacted to the input terminal; the second edge of the film resistor is contacted to the output terminal; and the third edge of the film resistor is contacted to the ground terminal.

In a class of this embodiment, the film thermistor has a negative temperature coefficient or a positive temperature coefficient.

In another class of this embodiment, the film thermistor is a thick film thermistor or a thin film thermistor.

In another class of this embodiment, the film resistor is a thick film resistor or a thin film resistor.

In another class of this embodiment, the film thermistor is polygon-shaped or arc-shaped.

In another class of this embodiment, the film resistor is polygon-shaped or arc-shaped.

In a second embodiment of the invention described herein, provided is a temperature compensation attenuator comprising: a base; a film resistor having two edges; a film thermistor having a first edge, a second edge, and a third edge; an input terminal; an output terminal; and a ground terminal; wherein the film resistor and the film thermistor are disposed on the base; one edge of the film resistor is contacted to the input terminal; the other edge of the film resistor is contacted to the output terminal; the first edge of the film thermistor is contacted to the input terminal; the second edge of the film thermistor is contacted to the output terminal; and the third edge of the film thermistor is contacted to the ground terminal.

In a class of this embodiment, the film thermistor has a negative temperature coefficient or a positive temperature coefficient.

In another class of this embodiment, the film resistor is a thick film resistor or a thin film resistor.

In another class of this embodiment, the film thermistor is a thick film thermistor or a thin film thermistor.

In another class of this embodiment, the film thermistor is polygon-shaped or arc-shaped.

In another class of this embodiment, the film resistor is polygon-shaped or arc-shaped.

In a third embodiment of the invention described herein, provided is a temperature compensation attenuator comprising: a base; a first film thermistor having two edges; a second film thermistor having a first edge, a second edge; and a third edge; an input terminal; an output terminal; and a ground terminal; wherein the first film thermistor and the second film thermistor are disposed on the base; one edge of the first film thermistor is contacted to the input terminal; the other edge of the first film thermistor is contacted to the output terminal; the first edge of the second film thermistor is contacted to the input terminal; the second edge of the second film thermistor is contacted to the output terminal; the third edge of the second film thermistor is contacted to the ground terminal; and the first film thermistor has a temperature characteristic that is opposite to that of the second film thermistor.

In a class of this embodiment, the first film thermistor has a negative temperature coefficient.

In another class of this embodiment, the second film thermistor has a positive temperature coefficient.

In another class of this embodiment, the first film thermistor has a positive temperature coefficient.

In another class of this embodiment, the second film thermistor has a negative temperature coefficient.

In another class of this embodiment, the first film thermistor is a thick film thermistor or a thin film thermistor.

In another class of this embodiment, the second film thermistor is a thick film resistor or a thin film resistor.

In another class of this embodiment, the first film thermistor and the second film thermistor are polygon-shaped or arc-shaped.

As a result, by utilizing the film thermistor of the invention, a wideband temperature compensation attenuator with a distributed parameter circuit structure is constructed wherein the amount of attenuation varies with temperature. By connecting the temperature compensation attenuator of the invention to a high frequency or microwave active circuit, the variance of the gain of the high frequency or microwave active device or the drift of the frequency characteristic of the active device resulting from temperature variance can be compensated. Even under large environmental temperature variance, the attenuator of the invention can still ensure stability of the gain of the high frequency or microwave active device and compensate for the drift of the frequency characteristic of the active device.

Accordingly, the invention provides embodiments with the following advantages:

(a) Ultra wide band characteristic, minimal refection coefficient, high isolation and high rated power;
(b) Low cost, small size and high reliability;
(c) Ideal applicability for mobile communication terminals;
(d) Easy use, requiring no complex control methods and devices;
(e) Avoiding the need to solve the problem of signal synchronization;
(f) Ideal applicability for applications in outdoor or harsh environments, for instance, in a mobile communication repeater, a broadcasting and TV station, public antenna equipment, GPS, WLAN, etc.
(g) Suitable for compensating heat-generating power devices which cause changes in gain or power; and
(h) Suitable for use with test instruments which demand strict requirements on indoor temperature.

DETAILED DESCRIPTION OF THE EMBODIMENTS

Detailed description will be given below with reference to accompanying drawings.

Figure 1:
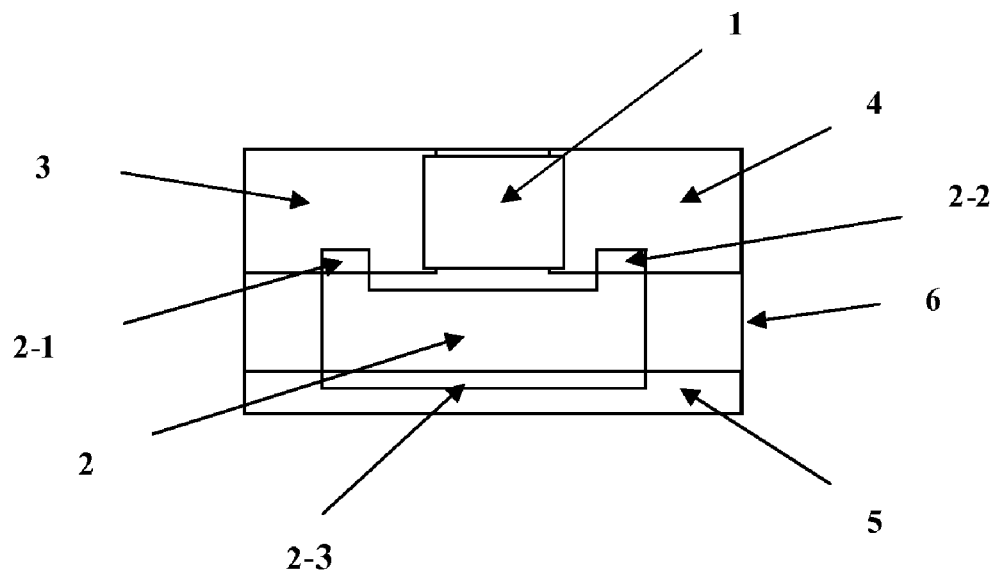
FIG. 1 is a schematic drawing of a temperature compensation attenuator according to the first embodiment of the invention.

As shown in FIG. 1, a temperature compensation attenuator of a first embodiment of the invention comprises: a base 6, a film thermistor 1, a film resistor 2 having a first edge 2-1, a second edge 2-2, and a third edge 2-3, an input terminal 3, an output terminal 4, and a ground terminal 5. The film thermistor 1 and the film resistor 2 are disposed on the base 6. One edge of the film thermistor 1 is contacted to the input terminal 3, and the other edge of the film thermistor 1 is contacted to the output terminal 4. The first edge 2-1 of the film resistor 2 is contacted to the input terminal 3, the second edge 2-2 of the film resistor 2 is contacted to the output terminal 4, and the third edge 2-3 of the film resistor 2 is contacted to the ground terminal 5. The film thermistor 1 has a negative temperature coefficient (NTC) or a positive temperature coefficient (PTC). When the film thermistor 1 has a NTC, the attenuator is a temperature compensation attenuator. When the film thermistor 1 has a PTC, the attenuator is an RF switch. The film thermistor 1 is a thick film thermistor or a thin film thermistor, and the film resistor 2 is a thick film resistor or a thin film resistor. The film thermistor 1 may be polygon-shaped, arc-shaped, round-shaped, or oval-shaped.

Taking a temperature compensation attenuator having an attenuation of 3 dB at 25° C. as an example of this embodiment, it is required that a frequency thereof is DC-6 GHz, the temperature is between −40° C. and +105° C., and the attenuation is between 5 dB and 1.8 dB. In this embodiment, the film thermistor 1 has a NTC and a resistance of 17 Ohm at 25° C. The resistance between the first edge 2-1 and the second edge 2-2 of the film resistor and that between the second edge 2-2 and the third edge 2-3 are equal to 152 Ohm. The following data are obtained: as temperature changes from 25° C. to −40° C., the attenuation changes from 3 dB to 5.1 dB; as the temperature changes from 25° C. to +105° C., the attenuation changes from 3 dB to 1.8 dB, and the standing wave ratio (SWR) is less than 1.3 at the frequency of 1 GHz.

Figure 2:
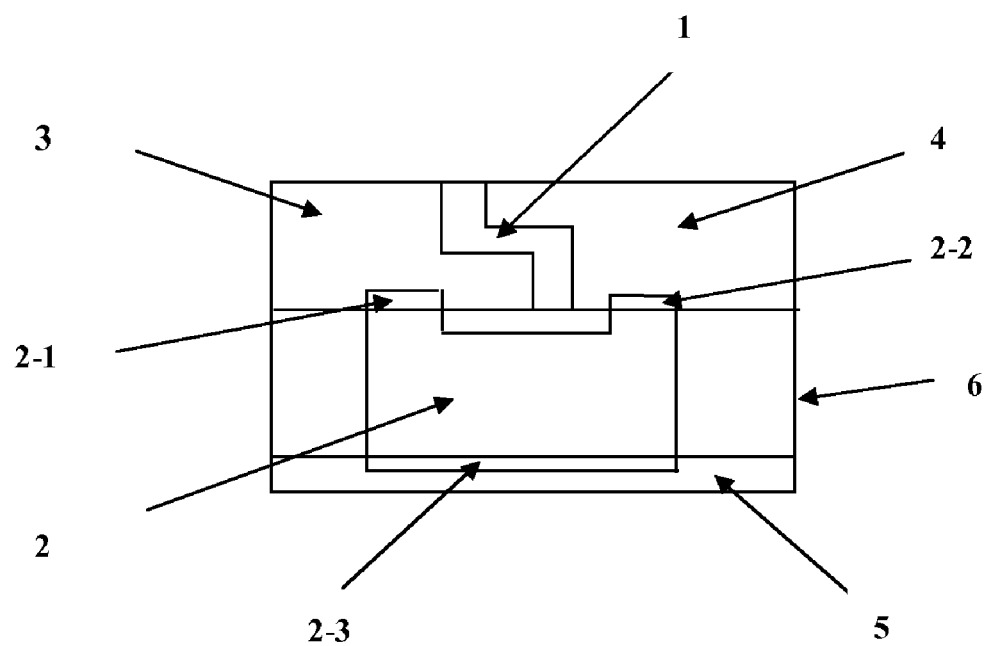
FIG. 2 is a schematic drawing of a temperature compensation attenuator according to the second embodiment of the invention.

Referring to FIG. 2, the temperature compensation attenuator of a second embodiment is nearly the same as that in FIG. 1, except that the film thermistor 1 is polygon-shaped and features better RF characteristics. Moreover, using the same materials as the substrate, the same size of the substrate, and the same resistance per square unit, the effective area of the film thermistor 1 is larger than that of a π-type or a T-type attenuator. Thus, the rated power of the attenuator of the invention is greater.

Figure 3:
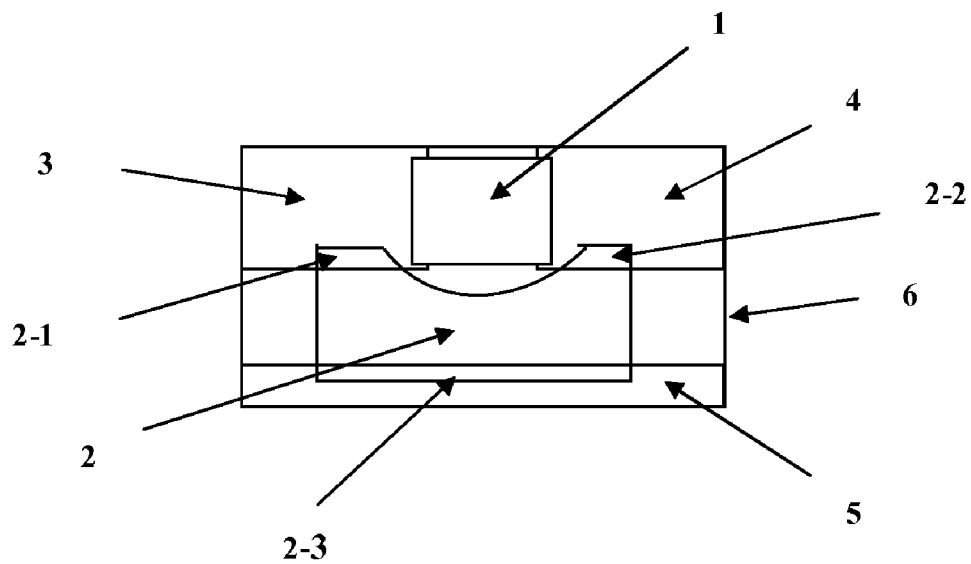
FIG. 3 is a schematic drawing of a temperature compensation attenuator according to the third embodiment of the invention.

Referring to FIG. 3, the temperature compensation attenuator of a third embodiment is nearly the same as that in FIG. 1, except that the film resistor 2 is arc-shaped.

Figure 4:
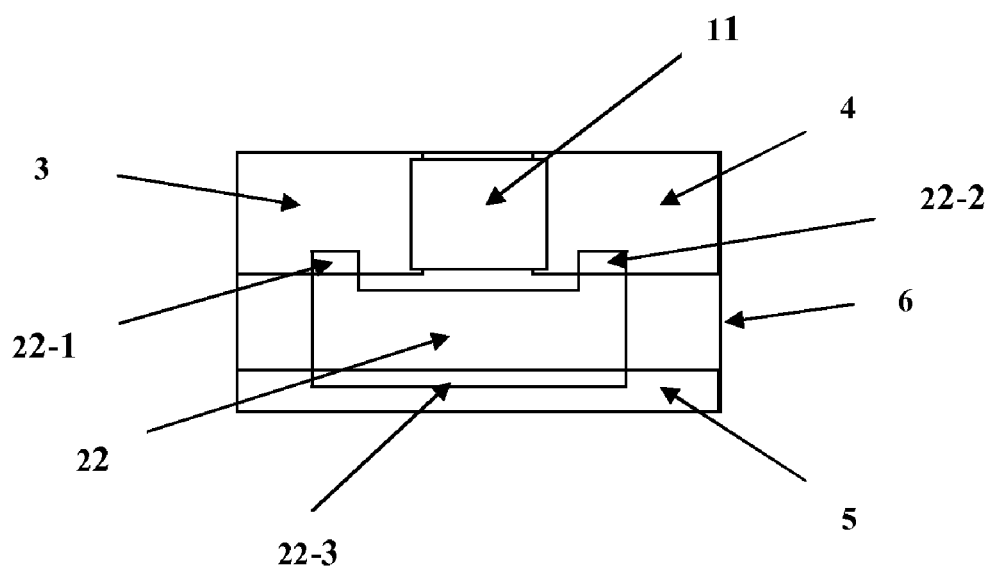
FIG. 4 is a schematic drawing of a temperature compensation attenuator according to the fourth embodiment of the invention.

Referring to FIG. 4, the temperature compensation attenuator of a fourth embodiment of the invention comprises: base 6, a film resistor 11, a film thermistor 22 having a first edge 22-1, a second edge 22-2, and a third edge 22-3, an input terminal 3, an output terminal 4, and a ground terminal 5. The film resistor 11 and the film thermistor 22 are disposed on the base 6. One edge of the film resistor 11 is contacted to the input terminal 3, and the other edge of the film resistor 11 is contacted to the output terminal 4. The first edge 22-1 of the film thermistor 22 is contacted to the input terminal 3, the second edge 22-2 of the film thermistor 22 is contacted to the output terminal 4, and the third edge 22-3 of the film thermistor 22 is contacted to the ground terminal. Compared with the first embodiment, variation in the attenuation of the attenuator caused by temperature change is smaller.

Figure 5:
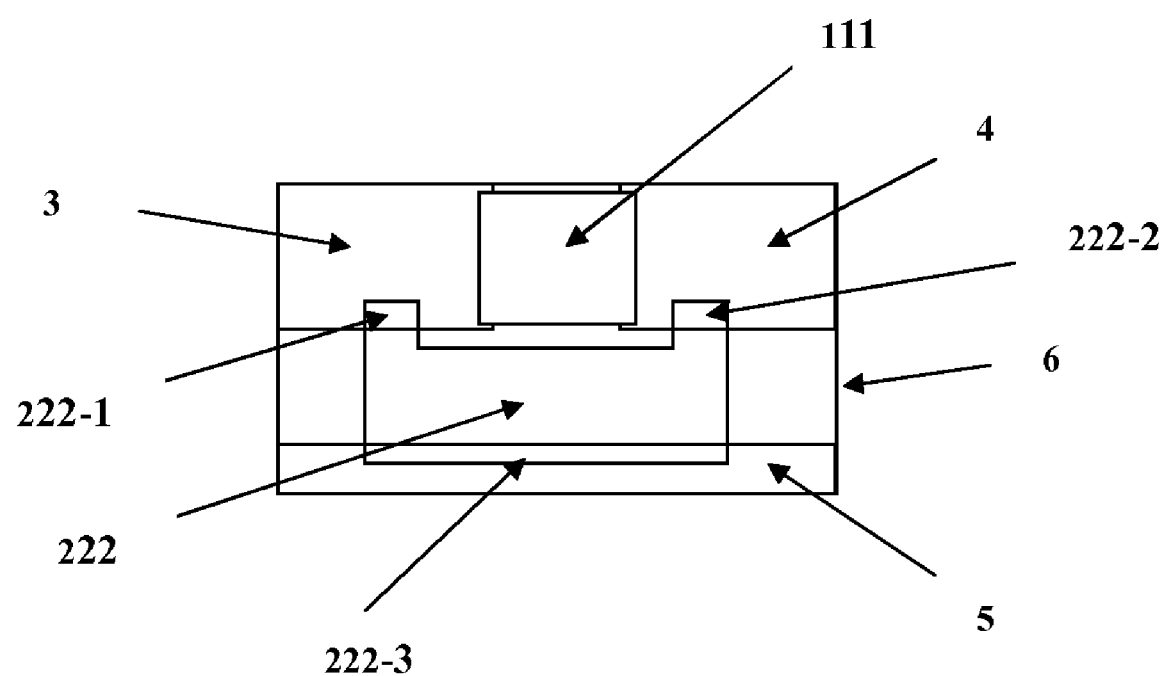
FIG. 5 is a schematic drawing of a temperature compensation attenuator according to the fifth embodiment of the invention.

Referring to FIG. 5, a temperature compensation attenuator of the fifth embodiment of the invention comprises: a base 6, a first film thermistor 111, a second film thermistor 222 having a first edge 222-1, a second edge 222-2 and a third edge 222-3, an input terminal 3, an output terminal 4, and a ground terminal 5. The first film thermistor 111 and the second film thermistor 222 are disposed on the base 6. One edge of the first film thermistor 111 is contacted to the input terminal 3, and the other edge of the first film thermistor 111 is contacted to the output terminal 4. The first edge 222-1 of the second film thermistor 222 is contacted to the input terminal 3, the second edge 222-2 of the second film thermistor 222 is contacted to the output terminal 4, and the third edge 222-3 of the second film thermistor 222 is contacted to the ground terminal 5.

While the first film thermistor 111 has a NTC, the second film thermistor 222 has a PTC, and the attenuator is a temperature compensation attenuator. While the first film thermistor 111 has a PTC, the second film thermistor has a NTC, and the attenuator is an RF switch.

The first film thermistor 111 is a thick film thermistor or a thin film thermistor, and the second film thermistor 222 is a thick film resistor or a thin film resistor.

The first film thermistor 111 and the second film thermistor 222 are polygon-shaped, arc-shaped. circle-shaped, or oval-shaped.

Compared with the first embodiment and the second embodiment, the attenuator of this embodiment has the best RF characteristics, and variation in the attenuation of the attenuator caused by temperature change is the largest.

This invention is not to be limited to the specific embodiments disclosed herein and modifications for various applications and other embodiments are intended to be included within the scope of the appended claims. While this invention has been described in connection with particular examples thereof, the true scope of the invention should not be so limited since other modifications will become apparent to the skilled practitioner upon a study of the drawings, specification, and following claims.

The invention claimed is:

1. A temperature compensation attenuator comprising:
   a base (6);
   a film thermistor (1) having two edges;
   a film resistor (2) having a first edge (2-1), a second edge (2-2) and a third edge (2-3);
   an input terminal (3);
   an output terminal (4); and
   a ground terminal (5);
   wherein
   said film thermistor (1) and said film resistor (2) are disposed on said base (6);
   one edge of said film thermistor (1) is contacted to said input terminal (3);
   the other edge of said film thermistor (1) is contacted to said output terminal (4);
   said first edge (2-1) of said film resistor (2) is contacted to said input terminal (3);
   said second edge (2-2) of said film resistor (2) is contacted to said output terminal (4); and
   said third edge (2-3) of said film resistor (2) is contacted to said ground terminal (5).

2. The temperature compensation attenuator of claim 1, wherein said film thermistor (1) has a negative temperature coefficient or a positive temperature coefficient.

3. The temperature compensation attenuator of claim 1, wherein said film thermistor (1) is a thick film thermistor or a thin film thermistor.

4. The temperature compensation attenuator of claim 1, wherein said film resistor (2) is a thick film resistor or a thin film resistor.

5. The temperature compensation attenuator of claim 1, wherein said film thermistor (1) is polygon-shaped or arc-shaped.

6. The temperature compensation attenuator of claim 1, wherein said film resistor (2) is polygon-shaped or arc-shaped.

7. A temperature compensation attenuator comprising
   a base (6);
   a film resistor (11) having two edges;
   a film thermistor (22) having a first edge (22-1), a second edge (22-2) and a third edge (22-3);
   an input terminal (3);
   an output terminal (4); and
   a ground terminal (5);
   wherein
   said film resistor (11) and film thermistor (22) are disposed on said base (6);
   one edge of said film resistor (11) is contacted to said input terminal (3);
   the other edge of said film resistor (11) is contacted to said output terminal (4);
   said first edge (22-1) of said thermistor (22) is contacted to said input terminal (3);
   said second edge (22-2) of said thermistor (22) is contacted to said output terminal (4); and
   said third edge (22-3) of said thermistor (22) is contacted to said ground terminal (5).

8. The temperature compensation attenuator of claim 7, wherein said film thermistor (22) has a negative temperature coefficient or a positive temperature coefficient.

9. The temperature compensation attenuator of claim 7, wherein said film resistor (11) is a thick film resistor or a thin film resistor.

10. The temperature compensation attenuator of claim 7, wherein said film thermistor (22) is a thick film thermistor or a thin film thermistor.

11. The temperature compensation attenuator of claim 7, wherein said film thermistor (22) is polygon-shaped or arc-shaped.

12. The temperature compensation attenuator of claim 7, wherein said film resistor (11) is polygon-shaped or arc-shaped.

13. A temperature compensation attenuator comprising
    a base (6);
    a first film thermistor (111) having two edges;
    a second film thermistor (222) having a first edge (222-1), a second edge (222-2) and a third edge (222-3);
    an input terminal (3);
    an output terminal (4); and
    a ground terminal (5);
    wherein
    said first film thermistor (111) and said second film thermistor (222) are disposed on said base (6);
    one edge of said first film thermistor (111) is contacted to said input terminal (3);
    the other edge of said first film thermistor (111) is contacted to said output terminal (4);
    said first edge (222-1) of said second film thermistor (222) is contacted to said input terminal (3);
    said second edge (222-2) of said second film thermistor (222) is contacted to said output terminal (4);
    said third edge (222-3) of said second film thermistor (222) is contacted to said ground terminal (5); and said first film thermistor (111) has a temperature characteristic opposite to that of said second film thermistor (222).

14. The temperature compensation attenuator of claim 13, wherein said first film thermistor (111) is a thick film thermistor or a thin film thermistor.

15. The temperature compensation attenuator of claim 13, wherein said second film thermistor (222) is a thick film thermistor or a thin film thermistor.

16. The temperature compensation attenuator of claim 13, wherein said first film thermistor (111) and said second film thermistor (222) are polygon-shaped or arc-shaped.

17. The temperature compensation attenuator of claim 13, wherein said first film thermistor (111) has a negative temperature coefficient.

18. The temperature compensation attenuator of claim 17, wherein said second film thermistor (222) has a positive temperature coefficient.

19. The temperature compensation attenuator of claim 13, wherein said first film thermistor (111) has a positive temperature coefficient.

20. The temperature compensation attenuator of claim 19, wherein said second film thermistor (222) has a negative temperature coefficient.

* * * * *